(12) United States Patent
McClure

(10) Patent No.: US 6,359,819 B1
(45) Date of Patent: Mar. 19, 2002

(54) CIRCUIT AND METHOD FOR PERFORMING A STRESS TEST ON A FERROELECTRIC MEMORY DEVICE

(75) Inventor: David C. McClure, Carrollton, TX (US)

(73) Assignee: STMicroelectronics, Inc.., Carrollton, TX (US)

( * ) Notice: Subject to any disclaimer, the term of this patent is extended or adjusted under 35 U.S.C. 154(b) by 0 days.

(21) Appl. No.: 09/751,007

(22) Filed: Dec. 29, 2000

(51) Int. Cl.⁷ .................................................. G11C 7/00
(52) U.S. Cl. ...................................... 365/201; 365/145
(58) Field of Search .................................. 365/201, 145

(56) References Cited

U.S. PATENT DOCUMENTS 5,661,730 A * 8/1997 Mitra et al. ................. 365/201
5,751,628 A * 5/1998 Hirano et al. ............... 365/201

* cited by examiner

Primary Examiner—Son T. Dinh
(74) Attorney, Agent, or Firm—Lisa K. Jorgenson; Andre Szuwalski

(57) ABSTRACT

A circuit and method for performing a stress test on a ferroelectric memory device. The memory device includes a memory cell array having a plurality of row lines, column lines and plate lines. The memory device further includes test circuitry for receiving at least one test control signal and in response to the at least one test control signal allowing a voltage differential to be applied between the column lines and the plate lines, so that a stress voltage may be applied across each of the memory cells at one time.

34 Claims, 3 Drawing Sheets

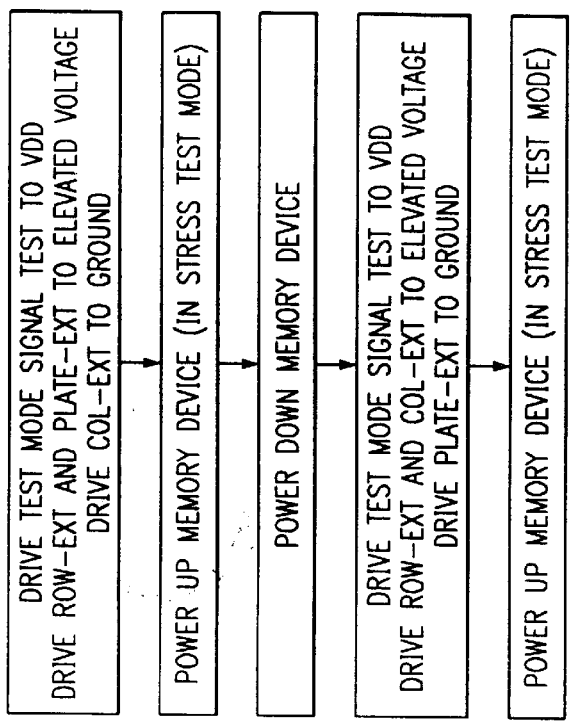
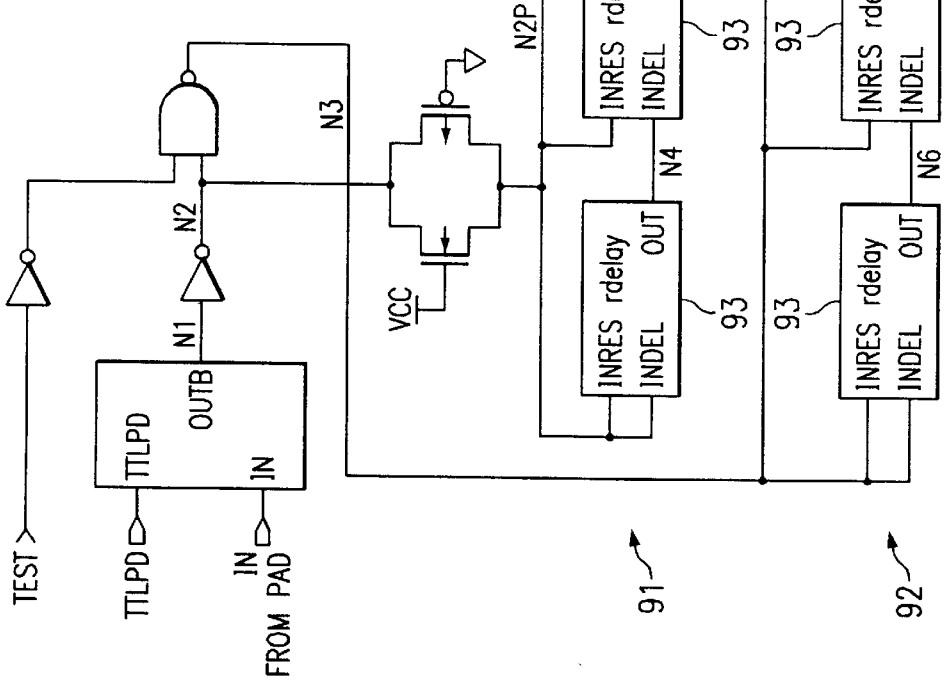

CIRCUIT AND METHOD FOR PERFORMING A STRESS TEST ON A FERROELECTRIC MEMORY DEVICE

BACKGROUND OF THE INVENTION

1. Technical Field of the Invention

The present invention relates to testing a ferroelectric memory device, and particularly to performing a stress test on a ferroelectric memory device.

2. Description of the Related Art

Ferroelectricity is a phenomenon which can be observed in a relatively small class of dielectrics called ferroelectric materials. In a normal dielectric, upon the application of an electric field, positive and negative charges will be displaced from their original position—a concept which is characterized by the dipole moment or polarization. This polarization or displacement will vanish, however, when the electric field returns back to zero. In a ferroelectric material, on the other hand, there is a spontaneous polarization—a displacement which is inherent to the crystal structure of the material and does not disappear in the absence of the electric field. In addition, the direction of this polarization can be reversed or reoriented by applying an appropriate electric field.

These characteristics result in ferroelectric capacitors, formed from ferroelectric film or material disposed between parallel conduction plates, being capable of storing in a nonvolatile manner a first charge corresponding to a first polarization state in which the direction of polarization is in a first direction, and a second charge corresponding to a second polarization state in which the direction of polarization is in a second direction opposite the first direction. Ferroelectric capacitors are utilized in nonvolatile random access memory devices having a memory cell array architecture that is similar to the memory cell array architecture of dynamic random access memory (DRAM) devices.

In general terms, there are two types of ferroelectric memory cells. Referring to FIG. 1A, a one transistor, one capacitor (1T1C) memory cell utilizes a pass gate transistor T connected between a column line B and a first plate of ferroelectric capacitor C. A second plate of ferroelectric capacitor C is connected to a plate line P. The gate terminal of pass gate transistor T is connected to a word line W. A memory device utilizing a 1T1C memory cell uses a reference memory cell that is accessed at the same time the 1T1C memory cell is accessed so as to provide a charge differential appearing across a pair of column lines coupled to the 1T1C cell and the reference cell. The use of 1T1C ferroelectric memory cells is known in the art.

Referring to FIG. 1B, a two transistor, two capacitor (2T2C) memory cell includes two ferroelectric capacitors C1 and C2. A first pass gate transistor T1 is connected between a first plate of ferroelectric capacitor C1 and a first column line BL of a column line pair. A second pass gate transistor T2 is connected between a first plate of ferroelectric capacitor C2 and a second column line BL' of the column line pair. A second plate of ferroelectric capacitors C1 and C2 is connected to a plate line P. The gate terminal of pass gate transistors T1 and T2 is connected to the word line W. Each capacitor C1 and C2 stores a charge representative of the polarization state thereof, the charge combining with the charge of the other capacitor to result in a charge differential appearing across column lines BL and BL' when the 2T2C memory cell is accessed. The polarity of the charge differential denotes the binary value stored by the 2T2C memory cell. The use of 2T2C ferroelectric memory cells is known in the art.

A problem with ferroelectric memory devices is the existence of a phenomenon known as imprint. Imprint is a characteristic of ferroelectric films that refers to the tendency of a ferroelectric film/capacitor to prefer one polarization state over another polarization state. Imprint is known to occur when a ferroelectric capacitor is maintained in a single polarization state for a prolonged period of time. Imprint adversely effects the ability of a ferroelectric capacitor to switch between the polarization states. Consequently, the existence of imprint may directly impact the performance of a ferroelectric memory device.

The performance of ferroelectric memory cells has been seen to degrade over time due to a number of other phenomena as well. For instance, ferroelectric memory cells may be effected by fatigue, retaining data over time, etc. When holding data over a prolonged period of time, such as under accelerated conditions during burn-in, a ferroelectric memory cell may be seen to degrade over the course of several hours or days. FIG. 2 shows how a ferroelectric memory cell may be degraded, with the polarization characteristic being shown for a normal ferroelectric memory cell in continuous set of lines and the polarization characteristic being shown for a degraded ferroelectric memory cell in dashed lines.

Often, integrated circuits are tested both before and after packaging to detect latent defects. One aspect of this testing procedure is referred to as "stress testing." Stress testing of integrated circuits, such as memory devices, is typically accomplished by applying an overvoltage to the gates of the transistors in the memory array. For example, testing on a memory device rated at five volts may be performed at nine volts. To perform this test, it is common to activate multiple wordlines and columns on a simultaneous basis thus applying the testing overvoltage at each memory cell within the memory array. Defective columns and rows may then be detected. The defective portions of the device are then replaced using built-in redundancy features, or the device is discarded as defective.

Based upon the foregoing, there is a need for a circuit and method for effectively performing a stress test on a ferroelectric memory device.

SUMMARY OF THE INVENTION

Embodiments of the present invention overcome shortcomings in testing ferroelectric memory devices and satisfy a significant need for suitably performing a stress test on the ferroelectric memory device. In accordance with an embodiment of the present invention, a ferroelectric memory device includes a memory array of memory cells organized into rows and columns, with each row of memory cells being coupled to a word line and a plate line and each column of memory cells being coupled to a bit line. The ferroelectric memory device further includes address decode circuitry for receiving an address value and asserting a signal appearing on at least one row line to connect at least one row of memory cells to the column lines. In addition, the ferroelectric memory device includes test circuitry for receiving at least one test control signal and in response to the at least one test control signal allowing a voltage differential to be applied between the column lines and the plate lines, so that a stress voltage may be applied across the ferroelectric capacitor of each of the memory cells.

The operation of the ferroelectric memory device in performing a stress test includes connecting each row of memory cells to the column lines and applying a stress voltage between the column lines and the plate lines for a predetermined period of time. In this way, the dielectric material of the capacitor of each memory cell is stressed at elevated voltages for detecting weak oxides, thin oxides, particle defects, etc. in the memory cells.

BRIEF DESCRIPTION OF THE DRAWINGS

A more complete understanding of the system and method of the present invention may be obtained by reference to the following Detailed Description when taken in conjunction with the accompanying Drawings wherein:

FIG. 4 is a schematic of an address input buffer of the ferroelectric memory device of FIG. 3; and FIG. 5 is a flow chart illustrating an operation of the ferroelectric memory device of FIG. 3 in accordance with an embodiment of the present invention.

DETAILED DESCRIPTION OF THE PREFERRED EXEMPLARY EMBODIMENTS

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 3:
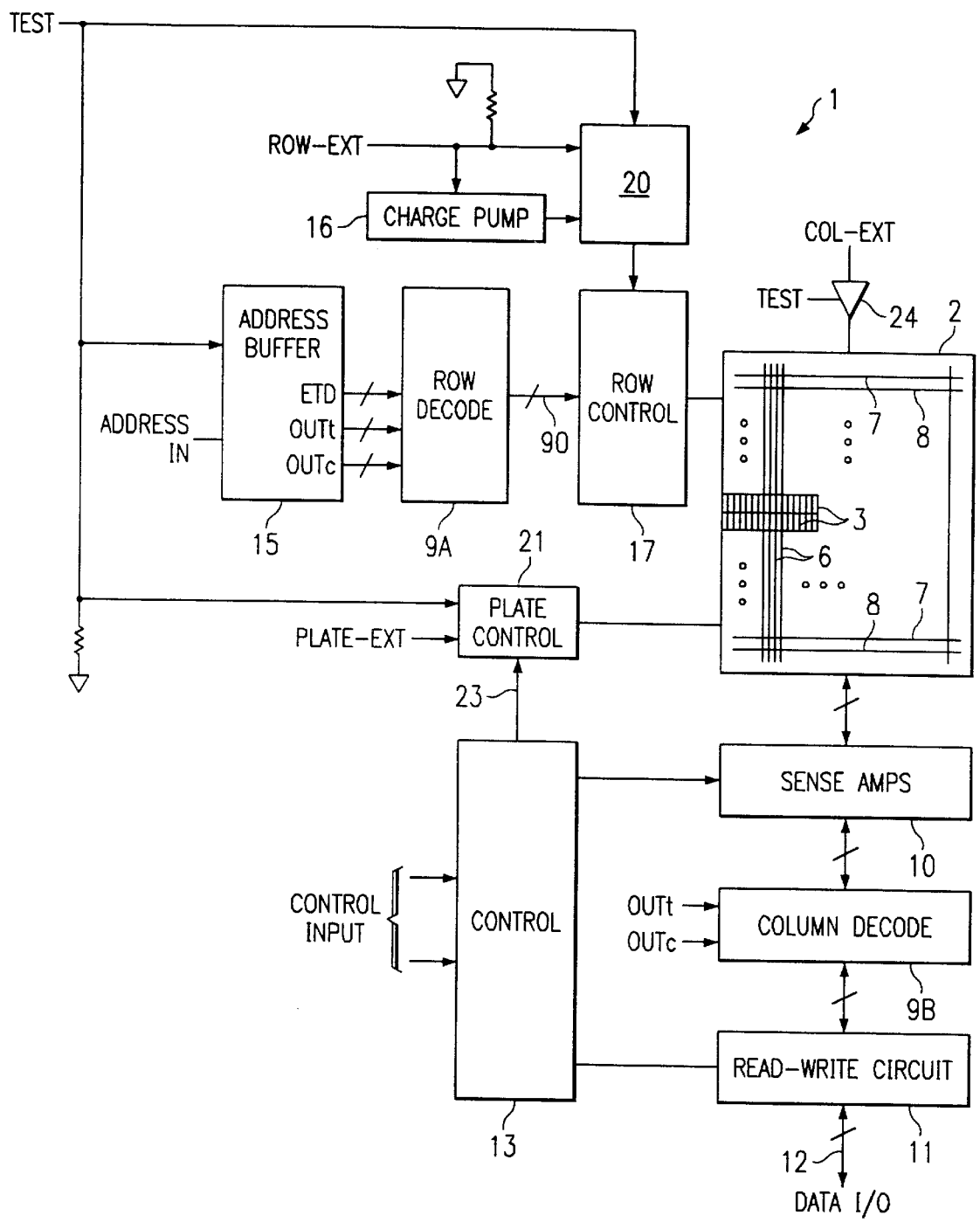
FIG. 3 is a block diagram of a ferroelectric memory device according to an embodiment of the present invention.

Referring to FIG. 3, there is shown a memory device 1 according to a first embodiment of the present invention. Memory device 1 is a nonvolatile memory device, such as a random access ferroelectric memory device. It is understood, however, that memory device 1 may be other memory devices as well. For instance, memory device 1 may include memory cells having elements other than ferroelectric capacitive elements that may provided a degraded performance over time.

In addition, memory device 1 may itself form an integrated circuit or be a memory device that is embedded with other circuitry within an integrated circuit.

Figure 1A:
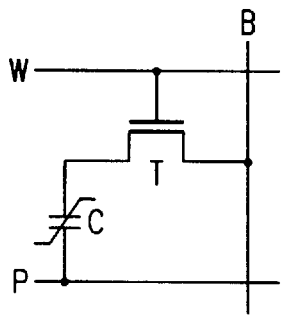
FIGS. 1A and 1B are schematics of 1T1C and 2T2C ferroelectric memory cells, respectively.
Figure 1B:
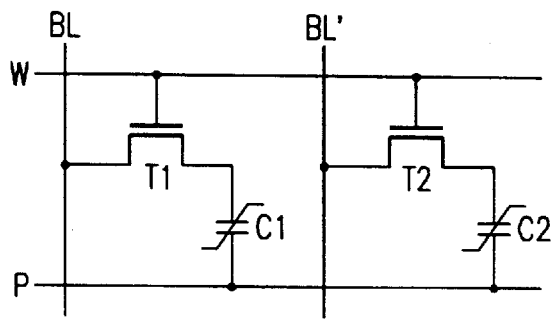
Figure 2:
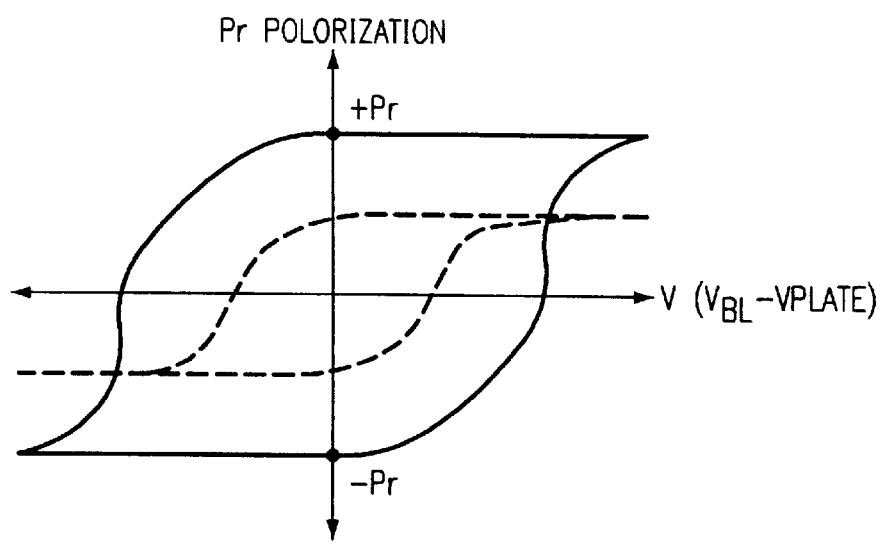
FIG. 2 is a plot of the polarization characteristic of a ferroelectric memory cell under normal and degraded operation conditions.

Memory device 1 includes a memory cell array 2 of memory cells 3. Memory cells 3 may be ferroelectric memory cells that include one or more ferroelectric capacitor elements C. Memory cell 3 may be implemented as a one transistor, one capacitor (1T1C) memory cell (FIG. 1A). Alternatively, memory cell 3 may be implemented as a two transistor, two capacitor (2T2C) memory cell (FIG. 1B).

It is understood that each memory cell 3 may be implemented in other ways using one or more ferroelectric capacitive elements or similar elements. Memory cell array 2 is arranged into rows and columns of memory cells 3. The memory cells 3 in a row of memory cells 3 are connected to a distinct word line 7 and a distinct plate line 8. The memory cells 3 in a column of memory cells 3 are connected to a distinct column line 6 or pair 5 thereof.

FIG. 3 shows plate lines 8 being parallel to word lines 7. In this configuration, plate lines 8 can be coupled to more than one row of memory cells 3. Alternatively, it is understood that plate lines 8 may be perpendicular to word lines 7. In this configuration, the voltage appearing across the ferroelectric capacitors in the memory cells 3 in rows that are not being accessed will not vary when the plate line 8 connected to such memory cells 3 is asserted. This is due to the fact that the transistors in the unaccessed memory cells 3 are turned off, so the plate connected to the transistor simply follows the voltage change appearing on the capacitor plate connected to the asserted plate line 8. In either the parallel or perpendicular configuration, it is understood that back plate lines 8 may be partitioned into smaller segments so that back plate lines 8 may be more easily driven.

Memory device 1 may include an address input buffer 15 which receives the address value provided to memory device 1 and generates a true and a complement version of the address value. The true version, output signal OUTt, and the complement version, output signal OUTc, may be generated by address input buffer 15 with necessary timing so as to substantially prevent a false address selection.

Memory device 1 further includes address logic, such as a row decoder circuit 9A, which receives and decodes true output signal OUTt and complement output signal OUTc from address input buffer 15. Row decoder circuit 9A generates a plurality of decoded output signals 90. In a normal mode of operation, output signals 90 identify a single row line 7 to be driven so as to connect the corresponding row of memory cells 3 to column lines 6. Row decoder circuit 9A may be implemented with combination logic so as to receive the true and complement versions of the address value.

Memory device 1 further includes a column decoder circuit 9B, which also receives and decodes true output signal OUTt and complement output signal OUTc from address input buffer 15. Based upon the decoded signals OUTt and OUTc, column decoder circuit 9B couples one or more column lines 6 to data input/output bus 12.

Memory device 1 includes a charge pump circuit 16 for boosting the row line 7 selected by row decode circuit 9A to an elevated or boosted voltage level. Charge pump circuit 16 ensures that the charge stored by memory cells 3 is fully shared with the corresponding column lines 6 during a memory read operation and that the capacitor C in each selected memory cell 3 is driven to the high reference voltage level Vdd during a memory write operation. During a memory access operation, row line control circuit 17 receives the decoded output signal 90 from row decode circuit 9A and the output of charge pump circuit 16, and in response drives the row line 7 identified by row decode circuit 9A to the boosted voltage level.

Sense amplifiers 10 are controlled to sense a charge differential appearing across a pair of column lines 6 and drive the column lines 6 to the high voltage reference Vdd and low voltage reference Vss based upon the polarity of the charge differential. Input/output (I/O) block 11 serves as an interface between column lines 6 and the external data input/output bus 12. A control circuit 13 provides necessary timing and control signals to memory cell array 2, address logic 9A and 9B, sense amplifiers 10 and data input/output block 11 to preform read and write memory access operations.

Memory device 1 is shown in FIG. 3 as having a bidirectional external data bus 12. It is understood that memory device 1 may include separate unidirectional data input and data output buses instead.

As stated above, a variety of conditions may exist which may result in the performance of one or more memory cells 3 of array 2 being degraded. In order to configure memory device 1 for stressing the transistor dielectrics and memory cell capacitor dielectrics at elevated voltages, memory device 1 includes test circuitry. The test circuitry a configures memory device 1 for effectively stressing the dielectrics therein (i.e., the dielectrics in ferroelectric capacitors C and the gate transistor dielectrics) by stressing the dielectrics in parallel. In this way, weak dielectrics, undesirably thin dielectrics and particle defects in memory device 1 may be efficiently identified.

Accordingly, a test mode signal TEST is received by the address input buffer 15 such that when test mode signal TEST is asserted, both the true output signals OUTt and the complement output signals OUTc of address input buffer 15 are asserted. This causes row decode circuit 9A to assert and/or drive each decoded output signal 90 that is input to row line control circuit 17 so as to indicate that memory cells 3 of each row 7 should be connected to column lines 6. Row line control circuit 17 responsively allows each row line 7 to be driven to a high voltage level to connect memory cells in each row to column lines 6.

FIG. 4 is a schematic of a single bit slice of the address input buffer 15 according to an embodiment of the present invention. It is understood that the bit slice is replicated once for each bit of the address input buffer 15. As shown in FIG. 4, address input buffer 15 utilizes a first signal path 91 for generating the true output signal OUTt and a second signal path 92 for generating the complement output signal OUTc. Each of the first and second signal paths includes series connected delay elements 93 which provide different propagation delay times between a falling edge transition and a rising edge transition. In this way, address input buffer 15 provides input glitch tolerance and prevents false address selection with output signal deassertion prior to one of true output signal OUTt and complement output signal OUTc being asserted. An edge transition detection (ETD) circuit 94 receives the true output signal OUTt and the complement output signal OUTc and generates an ETD output signal which is connected in a wired-NOR configuration with the ETD output signal of each bit slide of the address input buffer 15. Address input buffer 15 is described in greater detail in U.S. patent application Ser. No. 183,593, entitled "DEVICE AND METHOD FOR ADDRESS INPUT BUFFERING", filed Oct. 30, 1998, which is incorporated by reference herein in its entirety.

With further reference to FIG. 4, test mode signal TEST is applied as an input to both the first and second signal paths of address input buffer 15. As can be seen, asserting test mode signal TEST to a logic high state asserts both the true output signal OUTt and complement output signal OUTc, which forces address decode logic circuit 9 to assert each output thereof so that row line control circuit 17 is configured to drive each row line 7 of memory device 1 to the same voltage level simultaneously.

In order to stress the pass gate transistors of memory cells 3, it is necessary to be able to apply an elevated voltage to row line 7. It is desired to have no transistors in memory device 1 in the saturation mode of operation during a stress test, in order to maximize the electric fields applied to memory device 1 without experiencing latch-up or another breakdown condition. In addition, the boosted voltage provided to charge pump circuit 16 may be seen to fall during the course of a stress test. Further, it is desirable to be able to drive row lines 7 to an elevated voltage that is greater than the boosted voltage provided by charge pump 16. As a result, the test circuitry of memory device 1 selectively disables charge pump circuit 16 from operating and selectively decouples charge pump circuit 16 from row lines 7.

In particular, the charge pump circuit 16 is disabled by test mode signal TEST so that transistors therein are not in the saturation mode of operation. The test circuitry of memory device 1 includes a multiplexer circuit 20 that receives test mode signal TEST and responsively selects one of the output of charge pump circuit 16 and external signal Row-Ext for application to row control circuit 17 and therefore to row lines 7. When test mode signal TEST is asserted, for example, multiplexer circuit 20 connects external signal Row-Ext to row control circuit 17. External signal Row-Ext is connected to a pad (not shown) on the integrated circuit in which memory device 1 is formed, so that external signal Row-Ext may receive a voltage level that is applied from a device, such as a tester, that is external to the integrated circuit. The pad to which external signal Row-Ext is connected may be optionally connected to a package pin when the integrated circuit is packaged. In this case, a pull-down device may be used to pull external signal Row-Ext to the ground potential in an absence of a voltage being applied thereto. Similarly, a pull-down device may be used to pull test mode control signal TEST to the ground potential in an absence of a voltage being applied thereto.

In placing an elevated stress voltage on each row line 7 during a stress test, it is desirable to apply the elevated voltage to external signal Row-Ext and enter the test mode immediately following memory device 1 powering up. Doing so avoids current draw due to row lines 7 switching from a low reference voltage to the elevated voltage.

Further, in order to stress the dielectrics in the ferroelectric capacitor(s) of memory cells 3, it is necessary to place an elevated voltage differential between column lines 6 and plate lines 8. Accordingly, the test circuitry of memory device 1 includes multiplexer circuitry 21 that receives test mode signal TEST and responsively selects either one of external signal Plate-Ext and the drive signal 23 that is used to drive plate lines 8 during the normal mode of operation. External signal Plate-Ext is connected to a pad (not shown) on the integrated circuit so that a device external to the integrated circuit, such as a tester, may drive external signal Plate-Ext. In addition, the test circuitry may further include a noninverting gate 24 that connects an external signal Col-Ext to column lines 6 when test mode signal TEST is asserted, and disconnects external signal Col-Ext from column lines 6 when test mode signal TEST is deasserted. In this way, an elevated voltage differential may be applied between column lines 6 and plate lines 8 by driving one of external signals Plate-Ext and Col-Ext to an elevated voltage and the other to a ground potential.

It is understood that instead of coupling both plate lines 8 and column lines 6 to external sources during the stress test, only one of plate lines 8 and column lines 6 may be so coupled.

The operation of the memory device 1 will be described with reference to FIG. 5. Initially, test mode signal TEST is asserted, external signals Row-Ext and Plate-Ext are driven to an elevated voltage and external signal Col-Ext is driven to a lower voltage, such as the ground potential. Next, memory device 1 is powered up. With test mode signal TEST being asserted, memory device 1 is powered up into the test mode. Address input buffer 15 asserts output signals OUTt and OUTc so that row decode circuit 9A indicates to row control circuit 17 that each row line 7 is to be connected to external signal Row-Ext. With each memory cell 3 being connected to the column lines 6, and with an elevated voltage differential applied across column lines 6 and plate lines 8, the dielectrics in memory cells 3 are stressed under an electric field applied in a first direction.

Thereafter, memory device 1 may be powered down. Next, test mode signal TEST is maintained in the asserted state, external signals Row-Ext and Col-Ext are driven to an elevated voltage and external signal Plate-Ext driven to a lower voltage level, such as the ground potential. Memory device 1 is then powered up in the stress test mode. With each memory cell 3 being connected to the column lines 6, and with an elevated voltage differential applied across column lines 6 and plate lines 8, the dielectrics in memory cells 3 are stressed under an electric field applied in a second direction opposite the first direction.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A ferroelectric memory device, comprising:
    a memory array of memory cells organized into rows and columns, including a plurality of word lines, plate lines and bit lines, each row of memory cells being coupled to a word line and a plate line and each column of memory cells being coupled to a bit line, each memory cell comprising at least one ferroelectric capacitor and at least one transmission gate transistor connected thereto;
    address decode circuitry for receiving an address value and asserting a signal appearing on at least one row line to connect at least one row of memory cells to the column lines; and
    test circuitry for receiving at least one test control signal and in response to the at least one test control signal allowing a voltage differential to be applied between the column lines and the plate lines, so that a stress voltage may be applied across the at least one ferroelectric capacitor of the memory cells.

2. The ferroelectric memory device of claim 1, wherein the address decode circuitry is responsive to the at least one test control signal to selectively assert a signal on each row line so as to connect each row of memory cells to the column lines at one time.

3. The ferroelectric memory device of claim 1, wherein the address decode circuitry is responsive to the at least one test control signal to selectively assert a signal on each row line so as to connect each row of memory cells to the column lines during power up of the ferroelectric memory device.

4. The ferroelectric memory device of claim 1, further comprising:
    an address input buffer circuit for storing the received address value and providing the stored address value to the address decode circuitry on a plurality of true and complement output signals, the address input buffer being responsive to the at least one test control signal to selectively assert each true and complement output signal of the address input buffer circuit at the same time.

5. The ferroelectric memory device of claim 1, further comprising:
    charge pump circuitry coupled to the row lines, for generating a voltage level on the row lines in excess of a high reference voltage level;
    wherein the test circuitry is selectively disconnected from the row lines based upon the value of the at least one test control signal.

6. The ferroelectric memory device of claim 5, wherein the test circuitry includes a multiplexing circuit connected between the charge pump circuitry and the row lines, the at least one test control signal driving a selection input of the multiplexing circuit.

7. The ferroelectric memory device of claim 6, wherein:
    the ferroelectric memory device forms at least part of an integrated circuit; and
    a pad disposed on the integrated circuit is connected to an input of the multiplexing circuit so that the row lines are coupled to either of an output of the charge pump circuitry and the pad.

8. The ferroelectric memory device of claim 6, further comprising row line control circuitry connected between the multiplexing circuit and the row lines.

9. The ferroelectric memory device of claim 1, further comprising:
    a multiplexor circuit connected between one of the plate lines and the column lines, for selectively connecting an external signal to one of the plate lines and the column lines based upon the value of the at least one test control signal.

10. A method of testing a ferroelectric memory device having a plurality of memory cells arranged into rows and columns, with each row of memory cells being connected to a row line and a plate line and each column of memory cells being connected to a column line, comprising:
    connecting each row of memory cells to the column lines; and
    applying a stress voltage between the column lines and the plate lines for a predetermined period of time.

11. The method of claim 10, wherein the connecting of each row of memory cells to the column lines occurs at power up of the ferroelectric memory device.

12. The method of claim 10, wherein the connecting of each row of memory cells to the column lines comprises applying an externally generated voltage to the row lines.

13. The method of claim 10, wherein the connecting of each row of memory cells comprises decoupling the row lines from a charge pump circuit.

14. The method of claim 10, wherein the applying a stress voltage comprises applying the stress voltage of a first polarity between the column lines and the plate lines for a first predetermined period of time and applying a stress voltage of a second polarity, opposite the first polarity, between the column lines and the plate lines for a second predetermined period of time.

15. The method of claim 10, further comprising placing transistors in the ferroelectric memory device in a linear mode of operation prior to the step of applying a stress voltage.

16. An integrated circuit, comprising:
    a memory device, comprising:
        a memory array of memory cells organized into rows and columns, including a plurality of word lines, plate lines and bit lines, each row of memory cells being coupled to a word line and a plate line and each column of memory cells being coupled to a bit line, each memory cell comprising at least one capacitor and at least one transmission gate transistor connected in series between a plate line and a column line;
        address decode circuitry for receiving an address value and asserting a signal appearing on at least one row line to connect at least one row of memory cells to the column lines; and
        test circuitry for receiving at least one test control signal and in response to the at least one test control signal allowing a stress voltage differential to be applied across the column lines and the plate lines.

17. The integrated circuit of claim 16, wherein the address decode circuitry is responsive to the at least one test control signal to selectively assert a signal on each row line so as to connect each row of memory cells to the column lines at one time.

18. The integrated circuit of claim 16, wherein the address decode circuitry is responsive to the at least one test control signal to selectively assert a signal on each row line so as to connect each row of memory cells to the column lines during power up of the ferroelectric memory device.

19. The integrated circuit of claim 18, further comprising:

an address input buffer circuit for storing the received address value and providing the stored address value to the address decode circuitry on a plurality of true and complement output signals, the address input buffer is responsive to the at least one test control signal to assert each true and complement output signal of the address input buffer circuit.

20. The integrated circuit of claim 16, further comprising:

charge pump circuitry coupled to the row lines, for generating a voltage level on the row lines in excess of a high reference voltage level;

wherein the test circuitry is selectively disconnected from the row lines based upon the value of the at least one test control signal.

21. The integrated circuit of claim 20, wherein the test circuitry includes a multiplexing circuit connected between the charge pump circuitry and the row lines, the at least one test control signal driving a selection input of the multiplexing circuit.

22. The integrated circuit of claim 21, wherein:

a pad disposed on the integrated circuit is connected to an input of the multiplexing circuit so that the row lines are coupled to either of an output of the charge pump circuitry and the pad.

23. The integrated circuit of claim 22, further comprising row line control circuitry connected between the multiplexing circuit and the row lines.

24. The integrated circuit of claim 16, wherein the memory device comprises a ferroelectric memory device.

25. The integrated circuit of claim 16, wherein the memory device is embedded within the integrated circuit.

26. The ferroelectric memory device of claim 1, wherein:

the test circuitry provides an off-chip connection to at least one of the column lines and the plate lines, based upon the value of the at least one test control signal.

27. The ferroelectric memory device of claim 26, wherein:

the ferroelectric memory device is formed in an integrated circuit chip having a plurality of pads; and the off-chip connection provides a connection between a pad and the at least one of the column lines and the plate lines externally.

28. The ferroelectric memory device of claim 1, wherein:

the test circuitry provides an off-chip connection to at least one row line, based upon the value of the at least one test control signal.

29. Ferroelectric memory device of claim 1, wherein:

the test circuitry provides an off-chip connection to a plurality of row lines, based upon the value of the at least one test control signal.

30. The method of claim 10, further comprising:

driving one or more of the row lines to the stress voltage.

31. The method of claim 10, wherein the step of applying comprises:

providing an off-chip connection to at least one of the column lines and the plate lines; and externally driving the external connection to the at least one of the column lines and the plate lines to a voltage level so that a stress voltage is created between the column lines and the plate lines.

32. The method of claim 14, further comprising:

following applying the stress voltage of a first polarity and prior to applying the stress voltage of a second polarity, powering down the ferroelectric memory device; and powering up the ferroelectric memory device following powering down the ferroelectric memory device and prior to applying the stress voltage of a second polarity.

33. A ferroelectric memory device, comprising:

a memory array of memory cells organized into rows and columns, including a plurality of word lines, plate lines and bit lines, each row of memory cells being coupled to a word line and a plate line and each column of memory cells being coupled to a bit line, each memory cell comprising at least one ferroelectric capacitor and at least one transmission gate transistor connected thereto;

address decode circuitry for receiving an address value and asserting a signal appearing on at least one row line to connect at least one row of memory cells to the column lines; and test circuitry having an input for receiving at least one test control signal, the test circuitry selectively providing an external connection to at least one of the column lines and the plate line based upon the value of the at least one test control signal.

34. The ferroelectric memory device of claim 33, wherein the test circuitry selectively provides an external connection to one or more row lines, based upon the value of the at least one test control signal.

* * * * *